US006728942B2

(12) United States Patent
Lampaert et al.

(10) Patent No.: US 6,728,942 B2
(45) Date of Patent: Apr. 27, 2004

(54) METHOD AND SYSTEM FOR PREDICTIVE MOSFET LAYOUT GENERATION WITH REDUCED DESIGN CYCLE

(75) Inventors: Koen Lampaert, Irvine, CA (US); Andy Brotman, Irvine, CA (US); Paolo Miliozzi, Newport Beach, CA (US); Paramjit Singh, Lake Forest, CA (US); Mishel Matloubian, Irvine, CA (US); Bijan Bhattacharyya, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 124 days.

(21) Appl. No.: 09/879,142

(22) Filed: Jun. 12, 2001

(65) Prior Publication Data

US 2002/0188920 A1 Dec. 12, 2002

(51) Int. Cl.⁷ .......................... G06F 17/50; G06F 9/45; G06F 9/455

(52) U.S. Cl. ................ 716/10; 716/18; 716/8; 716/11; 716/12

(58) Field of Search .................. 716/10, 8, 11, 716/12, 18

(56) References Cited

U.S. PATENT DOCUMENTS

| | | |
|---|---|---|
| 4,827,428 A | 5/1989 | Dunlop et al. |
| 5,278,770 A | 1/1994 | Gore et al. |
| 5,379,231 A | 1/1995 | Pillage et al. |
| 5,796,985 A | 8/1998 | O'Brien et al. |
| 6,249,901 B1 | 6/2001 | Yuan et al. |
| 6,381,563 B1 | 4/2002 | O'Riordan et al. |

OTHER PUBLICATIONS

J. Ferrario et al., Moving from Mixed Signal to RF Test Hardware Development, ITC International Test Conference, pp. 948–956, Oct. 2001.*
F. Mu et al., Efficient High–Speed CMOS Design by Layout Based Schematic Method, Proceedings 24th Euromicro Conference, pp. 337–340, Aug. 1998.*
E. Charbon et al., Generalized Constraint Generation for Analog Circuit Design, 1993 IEEE/ACM International Conference on Computer–Aided Design, pp. 408–414, Nov. 1993.*
Chandrakasan, Anantha P.: "Scanning the Issue," Proceedings of the IEEE, vol. 88, No. 10, Oct., 2000, pp. 1525–1527.
Miliozzi, Paolo; Kundert, Ken; Lampaert, Koen; Good, Pete; and Chian, Mojy: "A Design System for RFIC: Challenges and Solutions," Proceedings of the IEEE, vol. 88, No. 10, Oct., 2000, pp. 1613–1631.

* cited by examiner

Primary Examiner—A. M. Thompson
(74) Attorney, Agent, or Firm—Farjami & Farjami LLP

(57) ABSTRACT

In one disclosed embodiment, a number of parameter values for an RF MOSFET are received. Examples of parameter values are style, bulk contact, finger width, finger length, number of fingers, current, and slice parameter values. From the received parameter values, a number of parasitic values for a subcircuit model of the RF MOSFET are determined. For example, parasitic resistor values and parasitic capacitor values of the RF MOSFET are determined. The parasitic resistor values and parasitic capacitor values are used in simulating the circuit comprising the RF MOSFET. An RF MOSFET layout is then generated that results in parasitic values that are the same as the parasitic values already used in simulating the circuit comprising the RF MOSFET. As such, the parasitic values of the RF MOSFET have already been taken into account in the initial circuit simulation.

46 Claims, 9 Drawing Sheets

Fig. 2

RF MOSFET

Symbol     Parameters

- $W_f$ — 204
- $L_f$ — 206
- $N_f$ — 208
- Current — 210
- Style — 212
- Slice — 214
- Bulk Contact — 216

(202 — symbol)

RF MOSFET Sub-Circuit Model

Style 1
(RF MOSFET Layout)

Fig. 5 Style 2 (RF MOSFET Layout)

Style 3
(RF MOSFET Layout)

Style 4
(RF MOSFET Layout)

US 6,728,942 B2

METHOD AND SYSTEM FOR PREDICTIVE MOSFET LAYOUT GENERATION WITH REDUCED DESIGN CYCLE

BACKGROUND OF THE INVENTION

1. Field of the Invention

The present invention is generally in the field of circuit design. More specifically, the present invention is in the field of designing circuits including at least one MOSFET.

2. Background Art

The demand for advanced consumer electronic devices, such as cellular phones and other wireless devices, has challenged semiconductor manufacturers to reduce the time-to-market for the low-power radio frequency integrated circuits ("RFIC") these products contain. In an effort to meet that challenge, semiconductor manufacturers use automated design systems that provide the designer with sets of tools and methodologies that reduce the entire design cycle of the RFIC.

A typical RFIC design system includes a design cycle that comprises various steps. For example, the steps in an RFIC design cycle can include circuit design and simulation, circuit layout generation, circuit layout verification, and extraction of parasitics from the circuit layout. The initial circuit design and simulation is performed before the designer has knowledge of the exact layout of the entire circuit, which is generated later in the design cycle. As a result, the designer has to attempt to predict and counteract the effect of various parasitics that might be introduced during layout design, which can severely degrade circuit performance.

Timing, voltage levels, and race conditions have to be re-verified after the designer knows of exact parasitics, such as parasitic capacitance, resistance, and inductance, extracted from circuit layout. Thus, a new circuit simulation incorporating correct values of the extracted parasitics from the circuit layout is required. Even then, the new circuit layout will often result in different values of extracted parasitics. Some parasitics may be eliminated, some new ones may be introduced, and some may increase or decrease, as such resulting in the need to redesign and re-simulate the circuit. The above steps are repeated, where the circuit design is modified by re-extracted parasitics from the circuit layout.

Without precise knowledge of the effect circuit modifications have on parasitics extracted from the circuit layout, the designer has to continually attempt to predict what new parasitics might be generated from the latest circuit modifications. Thus, the circuit's design cycle continues through numerous, time consuming iterations until the circuit layout parasitics have been correctly taken into account during the circuit design and simulation cycle. This repetitious cycle can result in many days or weeks of delay in completion of the circuit design for large circuit blocks. The resulting increase in "time-to-market" causes a tremendous economic loss to semiconductor design houses and manufacturers.

FIG. 1 shows flowchart 100, which illustrates a typical sequence of steps in a circuit's design, layout, and verification. In step 102 in FIG. 1, a circuit is designed and a schematic for the circuit is made. The circuit is also simulated in step 102. The circuit can be designed with the assistance of a commercial circuit design editor, such as Composer®, by Cadence Design Systems®, Inc. For example, a circuit comprising a number of RF MOSFETs can be input in the circuit schematic. As a part of the circuit design and schematic formation, parameters such as "finger width" ("$W_F$"), "finger length" ("$L_F$"), and "number of fingers" ("$N_F$") can be input in the circuit design editor and into the schematic. Thus, for example, the resulting circuit schematic would comprise symbols corresponding to the RF MOSFET, together with the above-mentioned parameters, i.e. $W_F$, $L_F$, and $N_F$.

A simulation program can simulate the electrical behavior of a circuit using the parameters that were input for the circuit's components. For example, the simulation program can predict the electrical behavior of RF MOSFETs mentioned above using the input parameters $W_F$, $L_F$, and $N_F$. However, the accuracy of the results obtained from the circuit simulation depend on the accuracy of all the circuit components, including a large number of parasitic components, whose values cannot generally be accurately estimated by conventional design techniques. The circuit simulation can be written and performed, for example, by using the SPICE® program.

In step 104, a circuit layout is generated in a layout generator. For example, the layout generator can interpret the $W_F$, $L_F$, and $N_F$ parameters of the RF MOSFETs that were input with the RF MOSFET's symbol in the circuit's schematic in step 102, and generate an RF MOSFET layout. The layout generator program can be written in SKILL®, C++, a combination of the two languages, or a combination of a number of other languages.

In step 106 in FIG. 1, a design rule check ("DRC") and a layout versus circuit schematic ("LVS") verification is performed on the circuit layout generated in step 104. DRC is performed to ensure that the circuit layout conforms to all manufacturing specifications. For example, the DRC program identifies problems such as "minimum-spacing" violations and "minimum-width" violations. In LVS, the circuit layout is checked against the circuit schematic to ensure electrical equivalence. In other words, the circuit layout is checked to see that it corresponds to the circuit schematic. By way of example, the LVS checking can be implemented using the Calibre® program and a rule file written in Calibre® format.

In step 108, parasitics are extracted from the circuit layout. For example, in an RF MOSFET layout, both the RF MOSFET's "internal" parasitics, and the parasitics generated by the interconnect routing between the RF MOSFET and other circuit components, are extracted. For example, the RF MOSFET's internal parasitics can include, among other things, the capacitance between the RF MOSFET's source and the "bulk" (i.e. the silicon substrate), and the resistance between the RF MOSFET's source and the "bulk."

It is noted that the RF MOSFET's internal parasitics have a great effect on circuit performance. The internal and interconnect routing parasitics are used by the circuit designer to modify the circuit schematic in step 102, and the circuit design cycle comprising steps 102, 104, 106, and 108 begins anew. A modified circuit layout is generated in step 104, and DRC and LVS are performed on the modified circuit layout in step 106. In step 108, parasitics are extracted from the modified circuit layout. For example, for the circuit comprising the RF MOSFET discussed above, both the RF MOSFET's "internal" parasitics, and the parasitics generated by the interconnect routing between the RF MOSFET and other circuit components, would again be extracted. Thus, the circuit design cycle comprising steps 102, 104, 106, and 108 as discussed above is repeated until circuit design and simulation step 102 can be performed with a high degree of confidence in the parasitic values that correspond to the circuit layout. As discussed above, the repetitive circuit design cycle significantly increases the time-to-market for integrated circuits such as RFICs.

Therefore, there exists a need for an integrated design system that provides a reduction in the time-to-market for integrated circuits, such as RFICs comprising RF MOSFETs. More specifically, there exists a need for an integrated design system that is able to predict the parasitics that will result from an RF MOSFET layout before the layout is generated, and thereby minimize undesirable repetition of the circuit design cycle.

SUMMARY OF THE INVENTION

The present invention is directed to method and system for predictive MOSFET layout generation with reduced design cycle. The invention provides a reduction in the time-to-market for integrated circuits, such as RFICs comprising RF MOSFETs. More specifically, the invention is an integrated design system that is able to predict the parasitics that will result from an RF MOSFET layout before the layout is generated, thereby minimizing undesirable repetitions in the circuit design cycle.

In one embodiment, the invention receives a number of parameter values for an RF MOSFET. Examples of parameter values are style, bulk contact, finger width, finger length, number of fingers, current, and slice parameter values. From the received parameter values, a number of parasitic values for a subcircuit model of the RF MOSFET are determined. For example, parasitic resistor values and parasitic capacitor values of the RF MOSFET are determined.

The parasitic resistor values and parasitic capacitor values are used in simulating the circuit comprising the RF MOSFET. According to the present invention, an RF MOSFET layout is then generated that results in parasitic values that are the same as the parasitic values already used in simulating the circuit comprising the RF MOSFET. As such, the parasitic values of the RF MOSFET have already been taken into account in the initial circuit simulation and there is no need to extract the internal parasitics of the RF MOSFET for further circuit simulations.

BRIEF DESCRIPTION OF THE DRAWINGS

FIG. 2 shows various symbols and the corresponding parameters of an exemplary RF MOSFET according to one embodiment of the present invention.

DETAILED DESCRIPTION OF THE INVENTION

Figure 1:
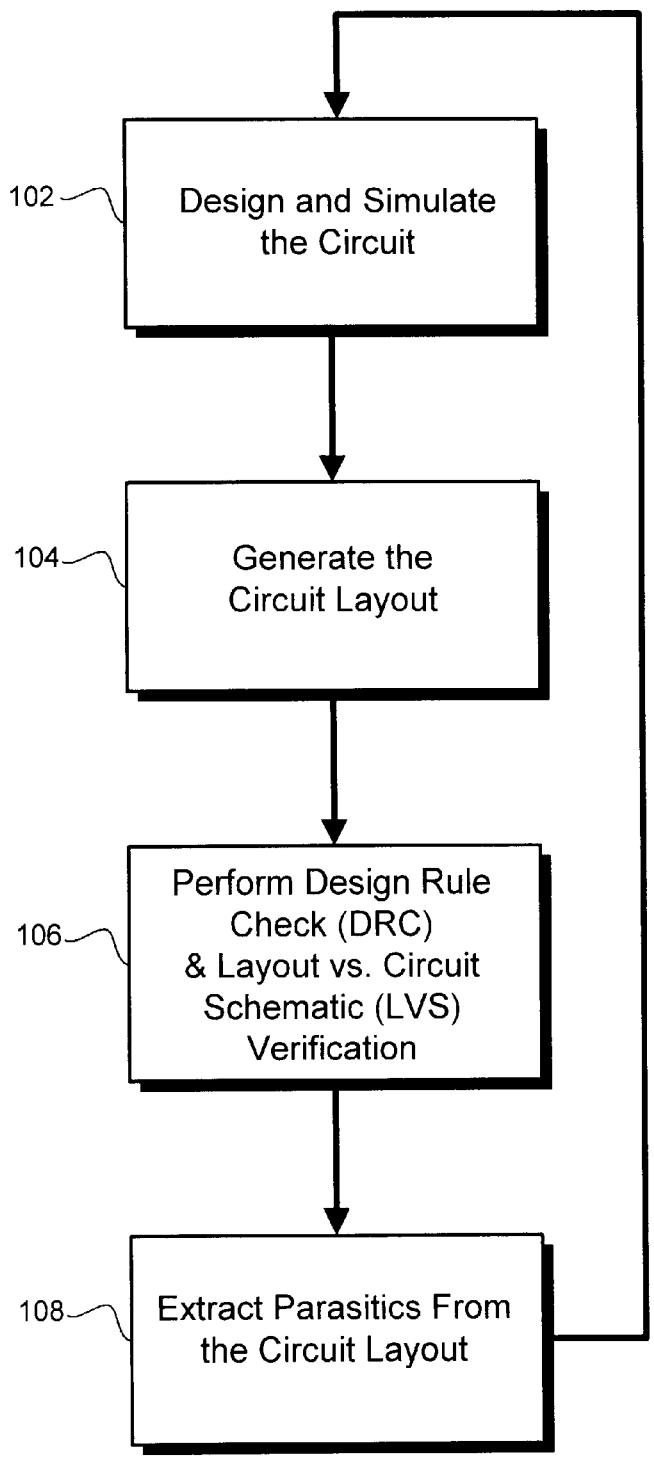
FIG. 1 is a flowchart of steps taken in a conventional circuit design cycle.

The present invention is directed to method and system for predictive MOSFET layout generation with reduced design cycle. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 2:
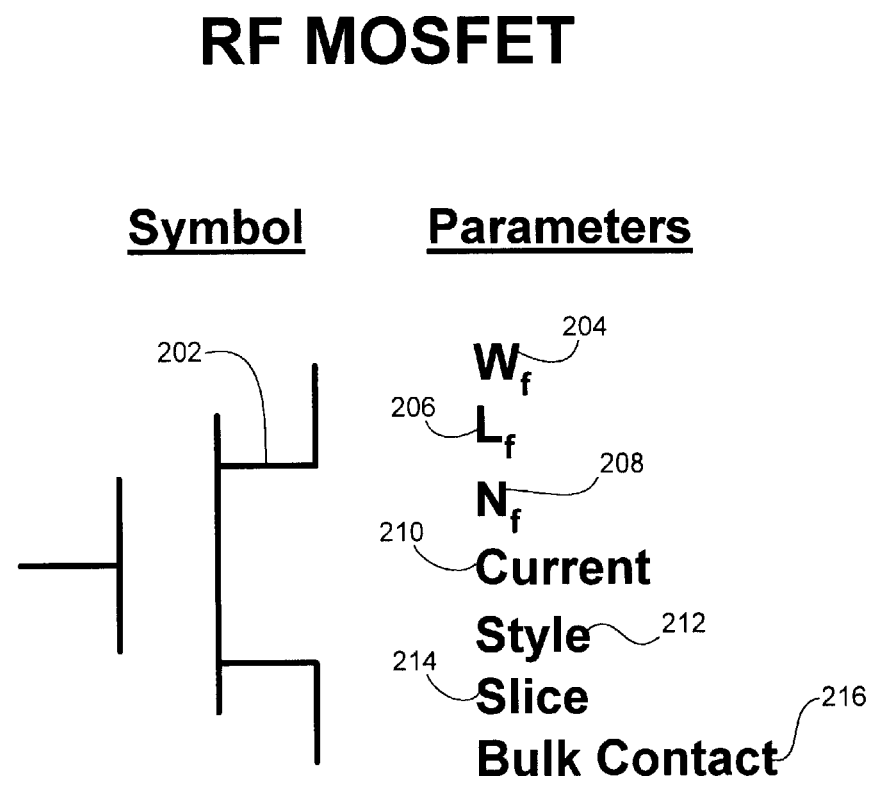

FIG. 2 shows a symbol and the corresponding parameters of an exemplary RF MOSFET. In FIG. 2, RF MOSFET symbol 202 is a symbol used in a circuit schematic to indicate an RF MOSFET. $W_f$ 204, $L_f$ 206, $N_f$ 208, Current 210, Style 212, Slice 214, and Bulk Contact 216 are exemplary RF MOSFET parameters utilized in an exemplary embodiment of the present invention to predict the parasitics of an RF MOSFET layout that will be generated using the same RF MOSFET parameters listed above. The parameters listed above are input in a circuit schematic and will be discussed below.

In FIG. 2, RF MOSFET parameter $W_f$ 204 determines the channel width of a gate finger in the corresponding RF MOSFET layout. In this embodiment of the invention, although the RF MOSFET layout may have multiple gate fingers connected in parallel, each gate finger will generally have the same channel width specified by RF MOSFET parameter $W_f$ 204. The total channel width of an RF MOSFET gate is equal to the number of gate fingers times the value of $W_f$ 204. The channel width of a gate finger is one factor that determines the size and geometry of an RF MOSFET. Thus, RF MOSFET parameter $W_f$ 204 affects the size and geometry of an RF MOSFET. In the present application, the numerical value of parameter $W_f$ 204 is also referred to as a "finger width parameter value."

RF MOSFET parameter $L_f$ 206 determines the channel length of a gate finger in an RF MOSFET layout. The total channel length of an RF MOSFET gate is equal to the value of $L_f$ 206, independent of the number of gate fingers. In the present embodiment, the gate in an RF MOSFET layout may have one or more fingers; however, each finger has the same channel length, referred to by $L_f$ 206. For example, in an exemplary RF MOSFET, $L_f$ 206 can be 0.18 micron. In the present application, the numerical value of parameter $L_f$ 206 is also referred to as a "finger length parameter value."

Also in FIG. 2, RF MOSFET parameter $N_f$ 208 determines the number of gate fingers connected in parallel in the same active area (i.e. diffusion area) in an RF MOSFET layout. For example, if the value of $N_f$ 208 is equal to three, three gate fingers would be connected in parallel in an RF MOSFET layout. In the above example, the RF MOSFET layout would comprise symmetrical source and drain areas. However, if RF MOSFET parameter $N_f$ 208 is an even number, the RF MOSFET's source and drain areas are not symmetrical. For example, if the value of $N_f$ 208 is equal to two, the resulting RF MOSFET layout would comprise two source areas, one on each of the outer sides of the two gate fingers, and a single drain area between the two gate fingers. According to the present embodiment, there is no design limit on the number of gate fingers in an RF MOSFET layout; however, the number of gate fingers must be an integer number. In the present application, the numerical value of parameter $N_f$ 208 is also referred to as a "number of fingers parameter value."

In FIG. 2, RF MOSFET parameter Current 210 determines the maximum electromigration current of an RF MOSFET. For example, if the value of RF MOSFET parameter Current 210 is equal to 1.0 milliampere, the metal contacting the source and drain of the RF MOSFET must be wide enough to accommodate at least 1.0 milliampere of current flow, without resulting in electromigration problems. Thus, the RF MOSFET parameter Current 210 determines the width of the metal interconnect that connect to the source and drain in a corresponding RF MOSFET layout. In the present application, the numerical value of parameter Current 210 is also referred to as a "current parameter value."

Further in FIG. 2, in the present embodiment of the invention, RF MOSFET parameter Style 212 specifies the "layout style" used in an RF MOSFET layout. A "layout style" determines how gate fingers, source areas, and drain areas of an RF MOSFET are connected together. Moreover, the layout style determines how interconnect lines are routed and connect to the gate fingers, source areas, and drain areas of an RF MOSFET. For example, in RF MOSFET Style 1 layout 400 in FIG. 4, the source areas of an RF MOSFET are connected in the metal level one, and the drain areas of the RF MOSFET are connected in metal level two. Style 212 will be further described below in relation to FIGS. 4, 5, 6, and 7.

RF MOSFET parameter Slice 214 determines the number of "sub-RF MOSFETs" connected in parallel in an RF MOSFET layout. For example, for a value of RF MOSFET parameter Slice 214 equal to twenty, a wide RF MOSFET can be split up into twenty multi-finger sub-RF MOSFETs that are connected in parallel. The resulting sub-RF MOSFETs are called "slices." In the present application, the numerical value of parameter Slice 214 is also referred to as a "slice parameter value."

Continuing with FIG. 2, RF MOSFET parameter Bulk Contact 216 determines the location of the "bulk" (i.e. substrate) contacts for an RF MOSFET. In an embodiment of the present invention, RF MOSFET parameter Bulk Contact 216 can designate four locations for a strip of substrate contacts for an RF MOSFET in an RF MOSFET layout. For example, RF MOSFET parameter Bulk Contact 216 can designate "l", "r", "t", or "b", respectively, to indicate bulk contacts on the left side, right side, top, or bottom of an RF MOSFET layout. RF MOSFET parameter Bulk Contact 216 can also designate "n" to indicate no bulk contacts in an RF MOSFET layout. RF MOSFET parameter Bulk Contact 216 can further designate any combination of "l", "r", "t", or "b" to indicate multiple locations of bulk contacts in an RF MOSFET layout. By further example, RF MOSFET parameter Bulk Contact 216 equal to "rt" designates a strip of bulk contacts on the right side and a strip of bulk contacts on the top of an RF MOSFET layout. The strip of bulk contacts is typically located as close to an RF MOSFET as design rules allow. In the present application, each designation such as "l", "r", "t", or "b", "n", and "rt" is also referred to as a "bulk contact parameter value."

Figure 3:
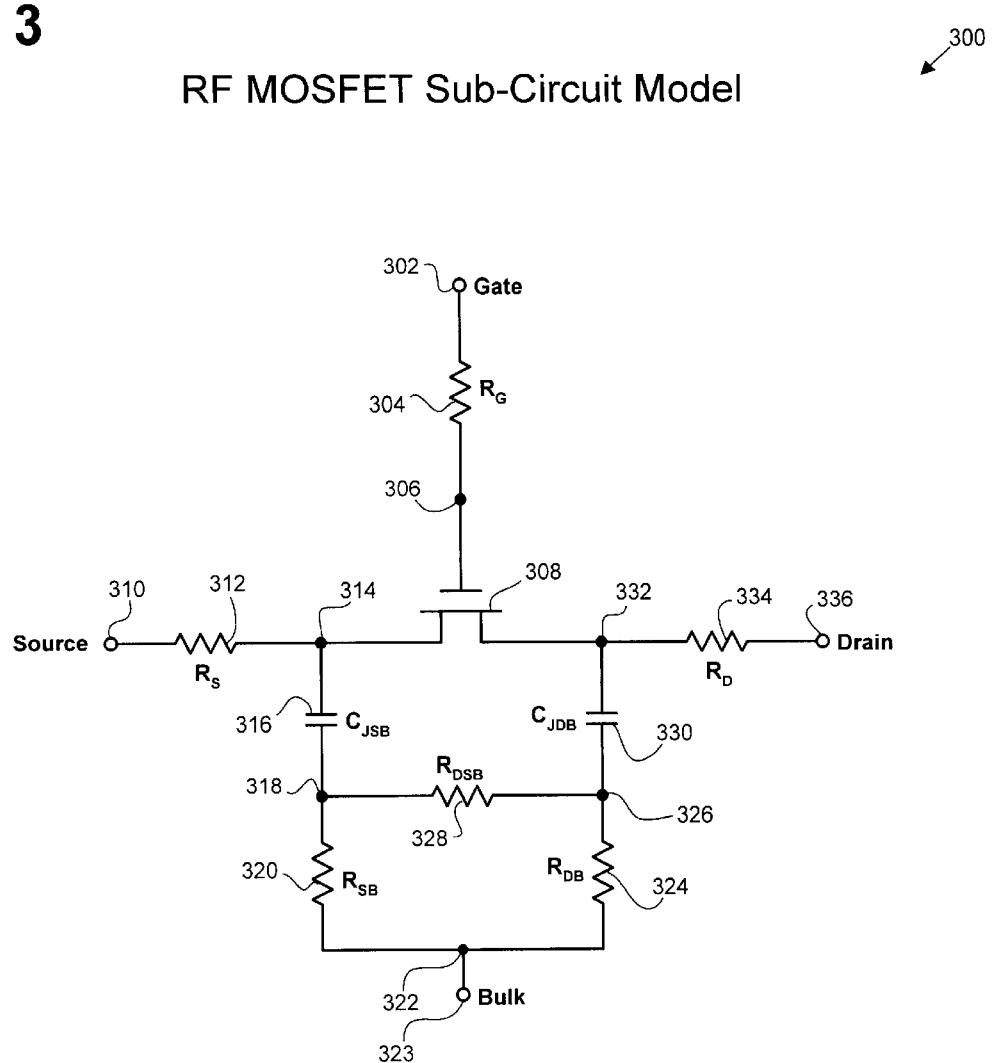
FIG. 3 shows a schematic diagram of an exemplary RF MOSFET subcircuit model in accordance with one embodiment of the present invention.

RF MOSFET subcircuit model 300 in FIG. 3 shows a schematic diagram of an exemplary RF MOSFET subcircuit model in accordance with one embodiment of the present invention. RF MOSFET subcircuit model 300 illustrates the internal parasitic resistances and capacitances of an RF MOSFET comprising gate 302, drain 336, and source 310. RF MOSFET 308 in FIG. 3 represent an ideal RF MOSFET without internal parasitic resistances and capacitances, hence referred to as an "ideal" RF MOSFET.

In FIG. 3, resistor $R_G$ 304 is connected between gate 302 and node 306. The gate of ideal RF MOSFET 308 is also connected to node 306. Resistor $R_S$ 312 is connected between source 310 and node 314. The source of ideal RF MOSFET 308 is connected to node 314. Capacitor $C_{JSB}$ 316 is connected between node 314 and node 318. Resistor $R_{SB}$ 320 is connected between node 318 and node 322. Resistor $R_{DB}$ 324 is connected between node 322 and node 326. Bulk 323 is connected at node 322. Resistor $R_{DSB}$ 328 is connected between node 318 and node 326. Capacitor $C_{JDB}$ 330 is connected between node 326 and node 332. The drain of ideal RF MOSFET 308 is also connected to node 332. Resistor $R_D$ 334 is connected between node 332 and drain 336.

Now discussing FIG. 3 in more detail, the present invention's RF MOSFET subcircuit model 300 in FIG. 3 is a simulation model that is used to precisely predict the electrical behavior of an RF MOSFET that is laid out using RF MOSFET parameters $W_f$, $L_f$, $N_f$, Current, Style, Slice, and Bulk Contact. RF MOSFET parameters $W_f$, $L_f$, $N_f$, Current, Style, Slice, and Bulk Contact, respectively, correspond to $W_f$ 204, $L_f$ 206, $N_f$ 208, Current 210, Style 212, Slice 214, and Bulk Contact 216 in FIG. 2. Parasitic resistors $R_G$ 304, $R_S$ 312, $R_{SB}$ 320, $R_{DSB}$ 328, $R_{DB}$ 324, $R_D$ 334, and parasitic capacitors $C_{JSB}$ 316 and $C_{JDB}$ 330 in FIG. 3 represent the internal parasitic resistances and capacitances of an RF MOSFET laid out in the manner specified by RF MOSFET parameters $W_f$, $L_f$, $N_f$, Current, Style, Slice, and Bulk Contact. As discussed below, RF MOSFET subcircuit model 300 uses various combinations of the above listed RF MOSFET parameters to calculate values of parasitic resistors $R_G$ 304, $R_S$ 312, $R_{SB}$ 320, $R_{DSB}$ 328, $R_{DB}$ 324, $R_D$ 334, and parasitic capacitors $C_{JSB}$ 316 and $C_{JDB}$ 330 in FIG. 3.

In one embodiment of the invention, the value of $R_G$ 304, the RF MOSFET parasitic gate resistance, is determined by RF MOSFET parameters $W_f$, $L_f$, $N_f$, Style, and Slice. The value of $R_S$ 312, the RF MOSFET parasitic source resistance, is determined by RF MOSFET parameters $W_f$, $N_f$, and Slice. The value of $R_{SB}$ 320, the RF MOSFET parasitic source-to-bulk (i.e. substrate) resistance, is determined by RF MOSFET parameters $W_f$, $L_f$, $N_f$, Current, Style, Slice, and Bulk Contact. The value of $R_{DSB}$ 328, the RF MOSFET parasitic source-to-drain resistance through the bulk, is determined by RF MOSFET parameters $W_f$, $L_f$, $N_f$, Style, Slice, and Bulk Contact. The value of $R_{DB}$ 324, the RF MOSFET parasitic drain-to-bulk resistance, is determined by RF MOSFET parameters $W_f$, $L_f$, $N_f$, Current, Style, Slice, and Bulk Contact. The value of $R_D$ 334, the RF MOSFET parasitic drain resistance, is determined by RF MOSFET parameters $W_f$, $N_f$, and Slice.

The value of $C_{JSB}$ 316, the RF MOSFET parasitic source-to-bulk capacitance, is determined by RF MOSFET parameters $W_f$, $N_f$, and Slice. The value of $C_{JDB}$ 330, the RF MOSFET parasitic drain-to-bulk capacitance, is also determined by RF MOSFET parameters $W_f$, $N_f$, and Slice. The performance of RF MOSFET transistor 308 is determined by RF MOSFET parameters $W_f$, $L_f$, $N_f$, and Slice. Thus the present invention utilizes RF MOSFET subcircuit model 300 in FIG. 3 and works in conjunction with other components of the present invention, such as the RF MOSFET parameters $W_f$, $L_f$, $N_f$, Current, Style, Slice, and Bulk Contact, to predict the parasitic resistance and capacitance values associated with a particular layout of an RF MOSFET, even before a circuit containing the RF MOSFET, and the RF MOSFET itself, are laid out.

Figure 4:
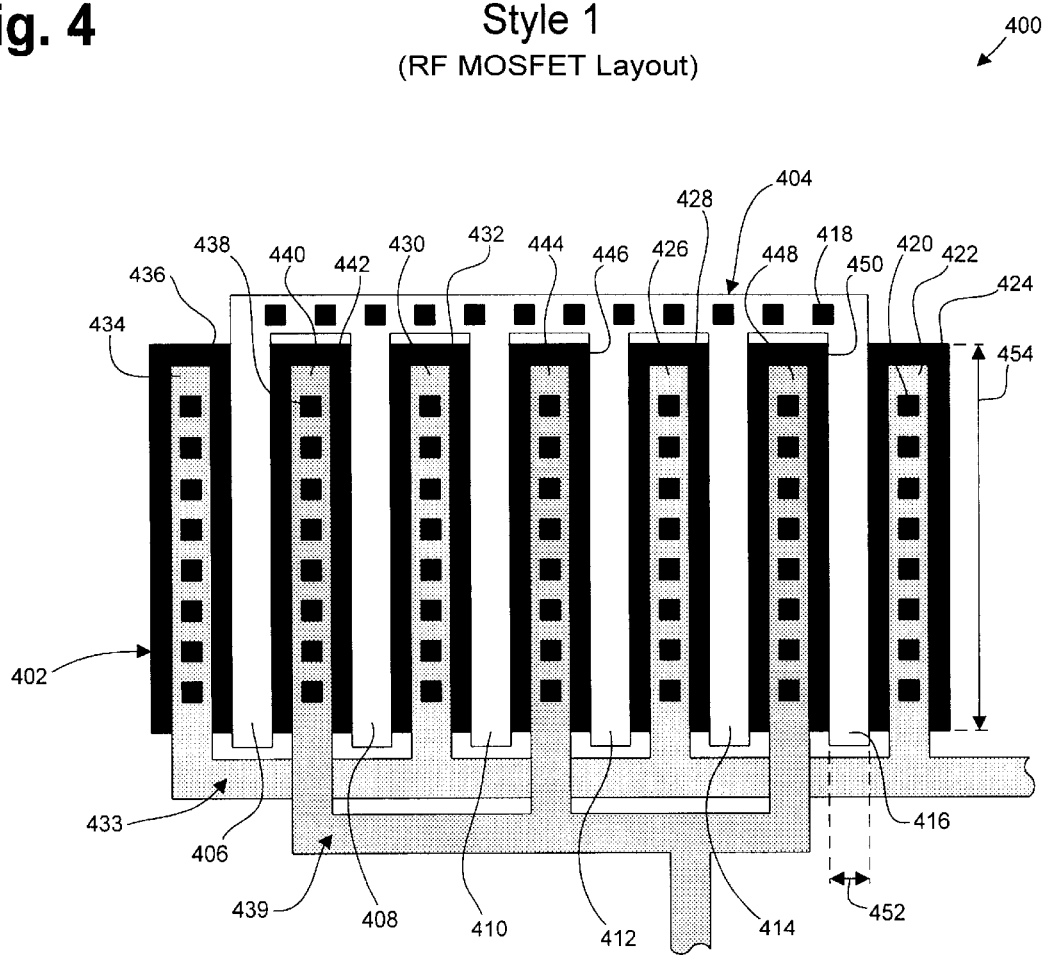
FIG. 4 illustrates an exemplary layout of an RF MOSFET corresponding to an exemplary style parameter value according to an embodiment of the present invention.

RF MOSFET Style 1 layout 400 in FIG. 4, also referred to as Style 1 layout 400, illustrates an exemplary RF MOSFET Style 1 layout in accordance with one embodiment of the present invention. In the example of FIG. 4, the "style parameter value" is "1," referring to Style 1. FIG. 4 shows diffusion area 402, and common gate poly 404 comprising gate fingers 406, 408, 410, 412, 414, and 416. Gate contact 418 and other gate contacts not specifically numbered are situated on a single row on common gate poly 404 as shown in FIG. 4. Source contact 420 and other source contacts not specifically numbered are situated on source contact strip 422. Source contact strips 422, 426, 430, and 434, respectively, are situated over source areas 424, 428, 432, and 436 in FIG. 4. Source areas 424, 428, 432, and 436 are collectively referred to as "composite source," also referred to simply as "source." Source contact strips 422, 426, 430, and 434 are connected to common source metal 433. In the present invention's Style 1 layout 400, common source metal 433 can be in metal level one of a semiconductor die.

Also in FIG. 4, drain contact 438 and other drain contacts not specifically numbered are situated on drain contact strip 440. Drain contact strips 440, 444, and 448, respectively, are situated over drain areas 442, 446, and 450. Drain areas 442, 446, and 450 are collectively referred to as "composite drain," also referred to simply as "drain." Drain contact strips 440, 444, and 448 are connected to common drain metal 439. In the present invention's Style 1 layout 400, common drain metal 439 can be in metal level two of a semiconductor dies. FIG. 4 also shows channel finger length ("$L_f$") 452 and channel finger width ("$W_f$") 454. In an exemplary RF MOSFET, $L_f$ 452 can be 0.18 microns and $W_f$ 454 can be 2.0 microns. It is noted that in FIG. 4, only gate contact 418, source contact 420, and drain contact 438 are specifically numbered and discussed herein to preserve brevity.

Now discussing Style 1 layout 400 in FIG. 4 in more detail, as seen in layout 400, common gate poly 404 does not overlap common drain metal 439. Therefore, there is less parasitic gate-to-drain capacitance between common gate poly 404 and drain areas 442, 446, and 450 in Style 1 layout 400. It is noted that the feedback provided from the drain to the gate of an RF MOSFET through the RF MOSFET's gate-to-drain capacitance produces an effective capacitance, i.e. "Miller capacitance," between gate and drain that is much larger than the actual gate-to-drain capacitance. Thus, because there is less gate-to-drain capacitance between common gate poly 404 and drain areas 442, 446, and 450 in Style 1 layout 400, that layout is an effective layout style for high frequency applications, e.g. RF applications, where parasitic capacitances and circuit delays need to be minimized. In other words, since the actual gate-to-drain overlap capacitance and, as a result, also the Miller capacitance, in Style 1 layout 400 are virtually equal to zero, this layout style is desirable in high speed RF applications.

Also, common drain metal 439 and common source metal 433 are in different metal levels of the semiconductor die, for example common drain metal 439 can be in metal level two and common source metal 433 can be in metal level one. Thus, common source metal 433 and common drain metal 439 are easy to route in Style 1 layout 400, which in turn allows "slices" of RF MOSFET structures to be easily connected together to achieve a larger RF MOSFET.

Figure 5:
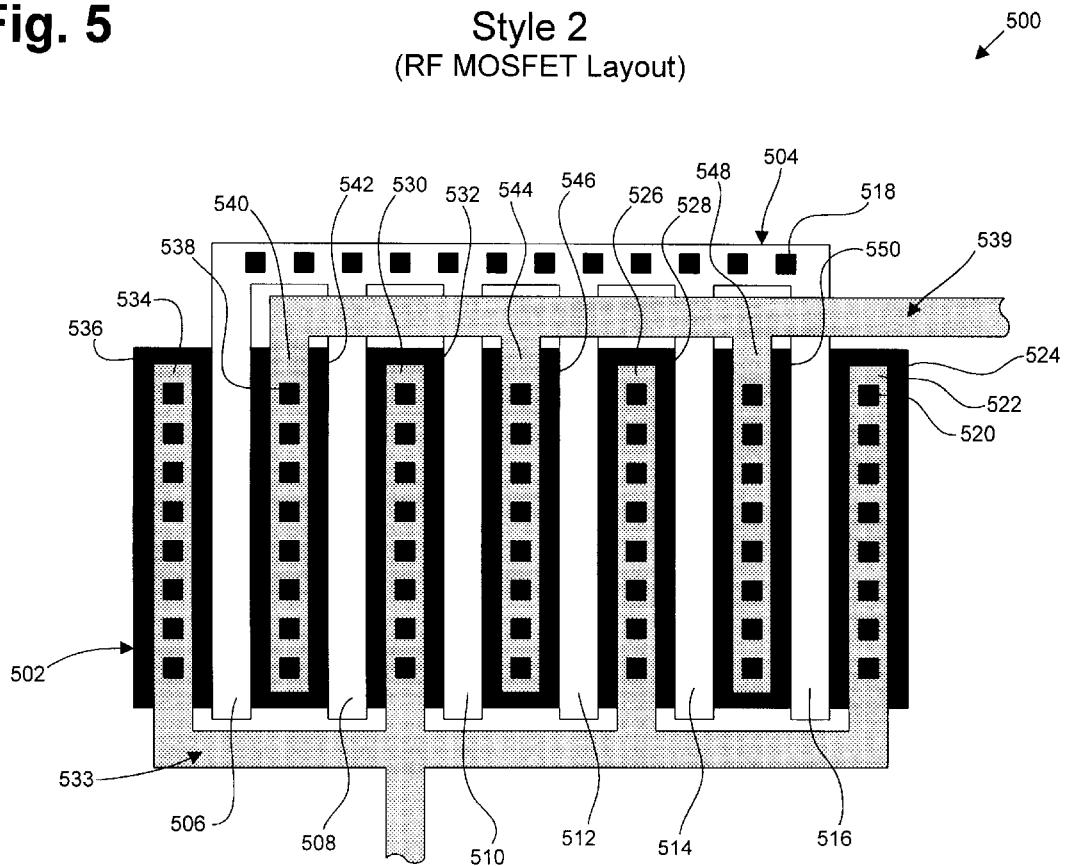
FIG. 5 illustrates an exemplary layout of an RF MOSFET corresponding to an exemplary style parameter value according to an embodiment of the present invention.

RF MOSFET Style 2 layout 500 in FIG. 5, also referred to as Style 2 layout 500, illustrates an exemplary RF MOSFET Style 2 layout in accordance with one embodiment of the present invention. In the example of FIG. 5, the "style parameter value" is "2," referring to Style 2. FIG. 5 shows diffusion area 502, and common gate poly 504 comprising gate fingers 506, 508, 510, 512, 514, and 516. Gate contact 518 and other gate contacts not specifically numbered are situated on common gate poly 504. Source contact 520 and other source contacts not specifically numbered are situated on source contact strip 522. Source contact strips 522, 526, 530, and 534, respectively, are situated over source areas 524, 528, 532, and 536 in FIG. 5. Source areas 524, 528, 532, and 536 are collectively referred to as "composite source," also referred to simply as "source." Source contact strips 522, 526, 530, and 534 are connected to common source metal 533.

Also in FIG. 5, drain contact 538 and other drain contacts not specifically numbered are situated on drain contact strip 540. Drain contact strips 540, 544, and 548, respectively, are situated over drain areas 542, 546, and 550. Drain areas 542, 546, and 550 are collectively referred to as "composite drain," also referred to simply as "drain." Drain contact strips 540, 544, and 548 are connected to common drain metal 539. It is noted that in FIG. 5, only gate contact 518, source contact 520, and drain contact 538 are specifically numbered and discussed herein to preserve brevity.

Now discussing Style 2 layout 500 in FIG. 5 in more detail, as seen in layout 500, common gate poly 504 overlaps common drain metal 539. Since common gate poly 504 overlaps common drain metal 539, there is a gate-to-drain parasitic capacitance between common gate poly 504 and drain areas 542, 546, and 550. As such, the resulting Miller capacitance would make Style 2 layout 500 not as effective for RF applications as Style 1 layout 400 in FIG. 4. However, common source metal 533 and common drain metal 539 can be in the same metal level in an embodiment of the present invention's Style 2 layout 500 in FIG. 5. In contrast, in Style 1 layout 400 in FIG. 4, common source metal 433 and common drain metal 439 are in different metal levels. For example, common source metal 433 is in metal level one and common drain metal 439 is in metal level two. With both common source and common drain metals in the same metal level, Style 2 layout 500 produces a "denser" overall layout than Style 1 layout 400 in FIG. 4. Thus, Style 2 layout 500 would be an effective RF MOSFET layout style where overall layout density is an important design factor.

Figure 6:
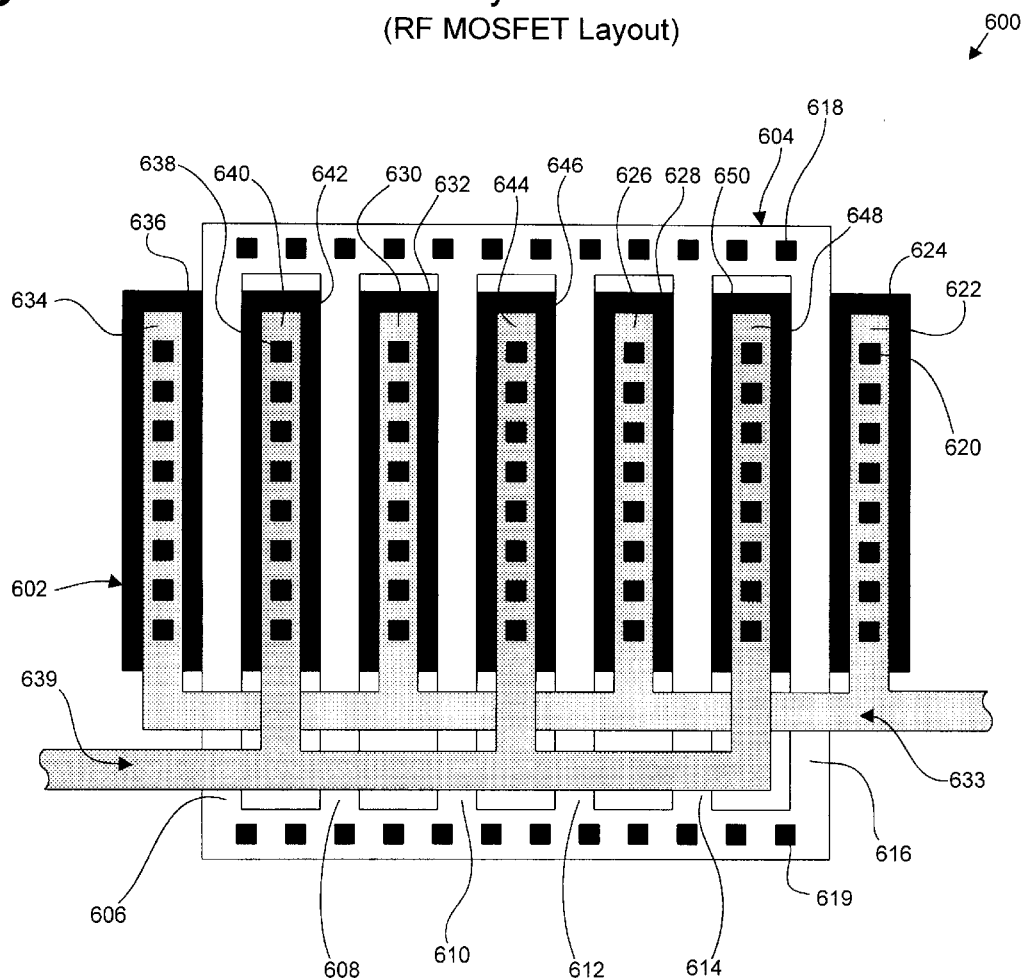
FIG. 6 illustrates an exemplary layout of an RF MOSFET corresponding to an exemplary style parameter value according to an embodiment of the present invention.

RF MOSFET Style 3 layout 600 in FIG. 6, also referred to as Style 3 layout 600, illustrates an exemplary RF MOSFET Style 3 layout in accordance with one embodiment of the present invention. In the example of FIG. 6, the "style parameter value" is "3," referring to Style 3. FIG. 6 shows diffusion area 602, and common gate poly 604 comprising gate fingers 606, 608, 610, 612, 614, and 616. Gate contact 618 and other gate contacts not specifically numbered are situated on one side of common gate poly 604 while gate contact 619 and other gate contacts not specifically numbered are situated on the opposite side of common gate poly 604. Source contact 620 and other source contacts not specifically numbered are situated on source contact strip 622. Source contact strips 622, 626, 630, and 634, respectively, are situated over source areas 624, 628, 632, and 636 in FIG. 6. Source areas 624, 628, 632, and 636 are collectively referred to as "composite source," also referred to simply as "source." Source contact strips 622, 626, 630, and 634 are connected to common source metal 633. In the present invention's Style 3 layout 600, common source metal 633 can be in metal level one of a semiconductor die.

Also in FIG. 6, drain contact 638 and other contacts not specifically numbered are situated on drain contact strip 640. Drain contact strips 640, 644, and 648, respectively, are situated over drain areas 642, 646, and 650. Drain areas 642, 646, and 650 are collectively referred to as "composite drain," also referred to simply as "drain." Drain contact strips 640, 644, and 648 are connected to common drain metal 639. In the present invention's Style 3 layout 600, common drain metal 639 can be in metal level two of a semiconductor die. It is noted that in FIG. 6, only gate contacts 618 and 619, source contact 620, and drain contact 638 are specifically numbered and discussed herein to preserve brevity.

Now discussing Style 3 layout 600 in FIG. 6 in more detail, the row of gate contacts comprising gate contact 618 is complemented by an opposing row of gate contacts comprising gate contact 619. Thus, Style 3 layout 600 provides layout flexibility in allowing common gate poly 604 to be contacted by two opposing rows of gate contacts, each row providing contact to a respective side of common gate poly 604. Additionally, by providing gate contacts on opposing sides of common gate poly 604, Style 3 layout 600 provides a lower gate resistance, i.e. the gate resistance is reduced by a factor of four. Since common gate poly 604 is typically made of relatively resistive material, such as polycrystalline silicon ("poly"), the dramatic reduction of the gate resistance is a significant advantage of Style 3 layout 600 shown in FIG. 6.

Figure 7:
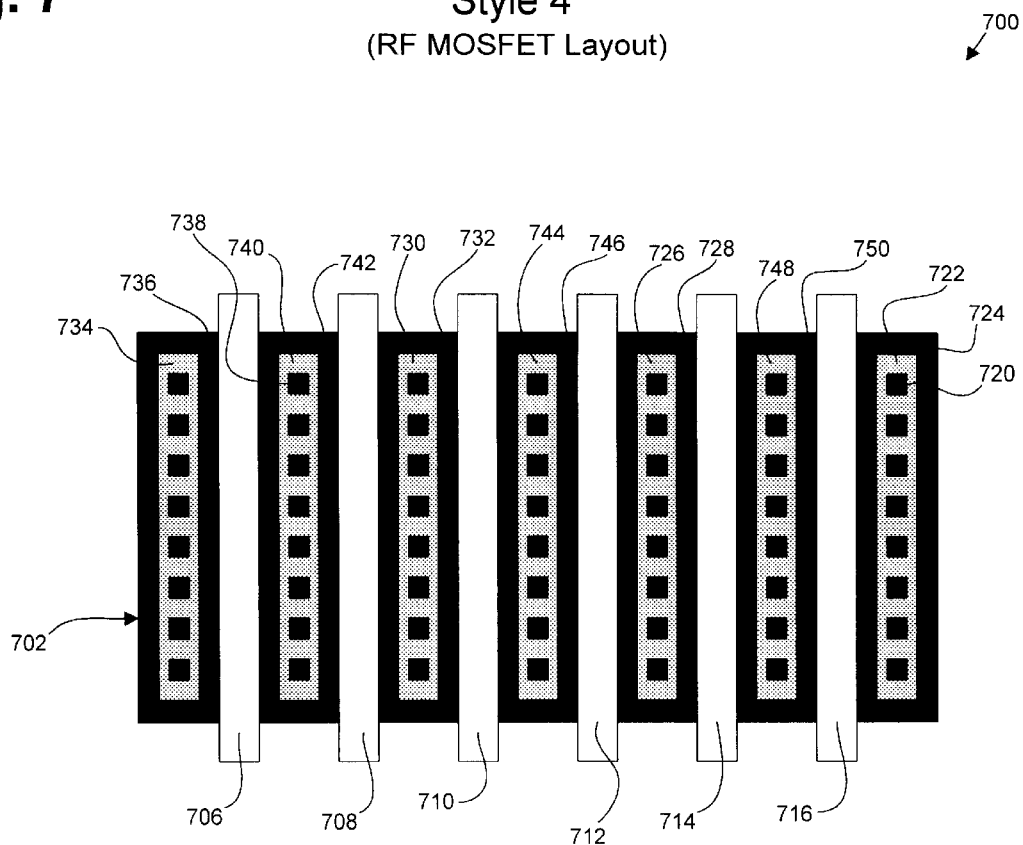
FIG. 7 illustrates an exemplary layout of an RF MOSFET corresponding to an exemplary style parameter value according to an embodiment of the present invention.

RF MOSFET Style 4 layout 700 in FIG. 7, also referred to as Style 4 layout 400, illustrates an exemplary RF MOSFET Style 4 layout in accordance with one embodiment of the present invention. In the example of FIG. 7, the "style parameter value" is "4," referring to Style 4. FIG. 7 shows diffusion area 702, and gate fingers 706, 708, 710, 712, 714, and 716. Source contact 720 and other source contacts not specifically numbered are situated on source contact strip 722. Source contact strips 722, 726, 730, and 734, respectively, are situated over source areas 724, 728, 732, and 736. Drain contact 738 and other drain contacts not specifically numbered are situated on drain contact strip 740. Drain contact strips 740, 744, and 748, respectively, are situated over drain areas 742, 746, and 750. It is noted that in FIG. 7, only source contact 720 and drain contact 738 are specifically numbered and discussed herein to preserve brevity.

Now discussing Style 4 layout 700 in FIG. 7 in more detail, gate fingers 706, 708, 710, 712, 714, and 716 are not connected together in Style 4 layout 700. Source contact strips 722, 726, 730, and 734 are also not connected together in Style 4 layout 700. Similarly, drain contact strips 740, 744, and 748 are not connected together in Style 4 layout 700. Thus, the present invention's Style 4 layout 700 in FIG. 7 provides a designer maximum flexibility to determine how to optimally place and utilize an RF MOSFET transistor in a particular circuit layout, and how to optimally route interconnect lines to the gate, drain, and source areas of the RF MOSFET. For example, a designer has the flexibility to connect drain contact strips 740, 744, and 748 in a first metal level of a semiconductor die. Alternatively, the designer could decide to connect drain contact strips 740, 744, and 748 in a second metal level of the semiconductor die.

Figure 8:
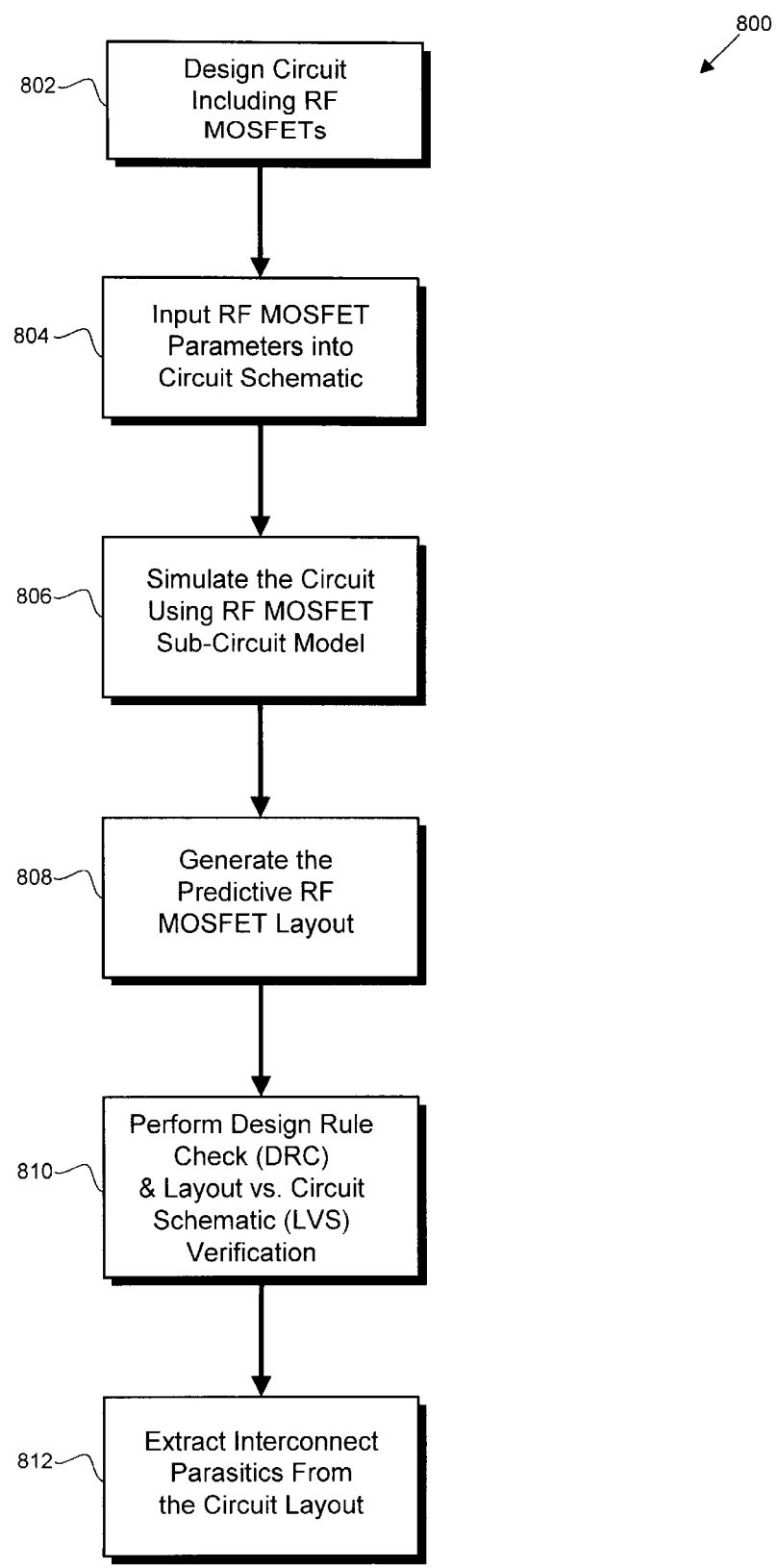
FIG. 8 is a flowchart illustrating a sequence of steps in accordance with an embodiment of the present invention.

FIG. 8 shows flowchart 800, which illustrates a sequence of steps in accordance with an embodiment of the present invention. In step 802, a circuit comprising at least one RF MOSFET is designed. In an embodiment of the invention, a circuit can be designed and a circuit schematic assembled with the assistance of a commercial schematic design editor, such as Composer®, by Cadence Design Systems®, Inc. In step 804, RF MOSFET parameters that exactly determine the layout of the RF MOSFET are input in the circuit schematic. For example, parameters "$W_f$," "$L_f$," "$N_f$," "Current," "Style," "Slice," and "Bulk Contact," corresponding to $W_f$ 204, $L_f$ 206, $N_f$ 208, Current 210, Style 212, Slice 214, and Bulk Contact 216 in FIG. 2, are input in the circuit schematic. In the present invention, the above parameters can be input in the circuit schematic using a schematic design editor, such as Composer®, by Cadence Design Systems®, Inc.

In step 806 in FIG. 8, the circuit is simulated using the present invention's RF MOSFET subcircuit model 300 in FIG. 3. The present invention's RF MOSFET subcircuit model 300 is calibrated to predict the electrical behavior of the RF MOSFET, including the RF MOSFET's internal parasitics, using the above listed parameters that were input in the circuit schematic in step 804. In a conventional circuit design cycle, such as the design cycle shown in flowchart 100 in FIG. 1, a designer would not know the values of the RF MOSFET's internal parasitics until after the parasitics were extracted from the circuit layout in a later step in the design cycle, such as step 108 in FIG. 1. In contrast to the conventional circuit design cycle, the present invention predicts, i.e. has advance knowledge of, the RF MOSFET's internal parasitics before the RF MOSFET layout is generated. Thus, the present invention enables the designer to design a circuit that incorporates an RF MOSFET's internal parasitics prior to RF MOSFET layout generation. In other words, the present invention enables the designer to design a circuit using knowledge of the values of the parasitics in an RF MOSFET layout before the RF MOSFET layout is generated.

In step 808, a "predictive" RF MOSFET layout is generated in a layout generator. For example, the layout generator uses RF MOSFET parameters, i.e. "$W_f$," "$L_f$," "$N_f$," "Current," "Style," "Slice," and "Bulk Contact," that were input in the circuit schematic in step 804 to generator an RF MOSFET layout. In other words, the layout generator interprets the values of the input RF MOSFET parameters and builds a layout representation of the RF MOSFET. The relationship between the RF MOSFET parameters listed above and a corresponding RF MOSFET layout generated using the above listed RF MOSFET parameters is discussed in detail below.

RF MOSFET parameter "$W_f$" determines the channel width of a gate finger in an RF MOSFET layout. In one embodiment of the invention, although an RF MOSFET layout may have multiple gate fingers connected in parallel, each gate finger will have the same channel width specified by RF MOSFET parameter "$W_f$." The total channel width of the RF MOSFET is thus equal to the number of gate fingers, i.e. "$N_f$," multiplied by the channel width of each gate finger, i.e. multiplied by "$W_f$." Manifestly, RF MOSFET parameter "$W_f$" affects the size and the parasitic capacitances and resistances of the RF MOSFET. For example, an increase in RF MOSFET parameter "$W_f$" would increase the width of the RF MOSFET's diffusion area. A wider diffusion area results in wider RF MOSFET source and drain areas, and would thus result in an increase in $C_{JSB}$ and $C_{JDB}$, the RF MOSFET's source-to-bulk and drain-to-bulk parasitic capacitances.

The channel length of a gate finger in an RF MOSFET layout is determined by RF MOSFET parameter "$L_f$." The total channel length of an RF MOSFET gate is independent of the number of gate fingers and is always equal to "$L_f$," which is the channel length of a single gate finger. Manifestly, RF MOSFET parameter "$L_f$" also affects the parasitic capacitances and resistances of an RF MOSFET. For example, the RF MOSFET's parasitic gate resistance, i.e. $R_G$, is inversely proportional to RF MOSFET parameter "$L_f$." Thus, an increase in channel length "$L_f$" results in a decrease in the RF MOSFET's parasitic gate resistance, i.e. a decrease in $R_G$.

RF MOSFET parameter "$N_f$" determines the number of gate fingers connected in parallel in the same active area (i.e. diffusion area) in an RF MOSFET layout. For example, if the value of "$N_f$" is equal to three, three gate fingers would be connected in parallel in an RF MOSFET layout. In that case, the RF MOSFET layout would comprise symmetrical source and drain areas. However, if RF MOSFET parameter "$N_f$" is an even number, the RF MOSFET's source and drain areas are not symmetrical. For example, if the value of "$N_f$" is equal to two, the resulting RF MOSFET layout would comprise two source areas, one on each of the outer sides of the two gate fingers, and a single drain area between the two gate fingers.

As stated above, RF MOSFET parameter "Current" determines the maximum electromigration current of an RF MOSFET. For example, if the value of RF MOSFET parameter "Current" is equal to 1.0 milliampere, the metal contacting the source and drain of the RF MOSFET must be wide enough to accommodate at least 1.0 milliampere of current flow without causing electromigration problems. Thus, the RF MOSFET parameter "Current" determines the width of the metals that connect to the source and drain in a corresponding RF MOSFET layout. The RF MOSFET parameter "Current" also affects $R_{SB}$, the parasitic source-to-bulk resistance, and $R_{DB}$, the parasitic drain-to-bulk resistance.

In the present invention, RF MOSFET parameter "Style" specifies the "layout style" used in an RF MOSFET layout. As illustrated by the examples given above, a "layout style" determines how gate fingers, source areas, and drain areas of an RF MOSFET are connected together. For example, in RF MOSFET Style 1 layout 400 in FIG. 4, the source areas of an RF MOSFET are connected in metal level one, and the drain areas of the RF MOSFET are connected in metal level two. In an embodiment of the present invention, RF MOSFET parameter "Style" can comprise Style 1 layout 400 in FIG. 4, Style 2 layout 500 in FIG. 5, Style 3 layout 600 in FIG. 6, and Style 4 layout 700 in FIG. 7. Manifestly, RF MOSFET parameter "Style" can also comprise a number of other layout styles. As discussed above, the parasitics inherent in a specific "layout style" can determine which "layout style" is optimal for certain types of applications. For example, in Style 1 layout 400 in FIG. 4, the effect of "Miller capacitance" is minimized and as such Style 1 layout 400 in FIG. 4 is an effective layout style for high frequency, for example RF, applications.

RF MOSFET parameter "Slice" determines the number of "sub-RF MOSFETS" connected in parallel in an RF MOSFET layout. For example, for a value of RF MOSFET parameter "Slice" equal to twenty, a wide RF MOSFET can be split up into twenty multi-finger sub-RF MOSFETs that are interconnected and form a single RF MOSFET. The resulting sub-RF MOSFETs are called "slices." When RF MOSFET parameter "Slice" divides an RF MOSFET into multiple sub-RF MOSFETs, the resulting sub-RF MOSFETs produce multiple parasitic resistances and capacitances. Thus, the overall parasitic resistances and capacitances of an RF MOSFET are affected, though usually not linearly, by the RF MOSFET "Slice" parameter "Slice."

RF MOSFET parameter "Bulk Contact" determines the location of the "bulk" (i.e. substrate) contacts for an RF MOSFET. As stated above, in an embodiment of the present invention, RF MOSFET parameter "Bulk Contact" can designate five locations for a strip of substrate contacts for an RF MOSFET in an RF MOSFET layout. For example, RF MOSFET parameter "Bulk Contact" can designate "l", "r", "t", or "b", respectively, to indicate bulk contacts on the left side, right side, top, or bottom of an RF MOSFET layout. RF MOSFET parameter "Bulk Contact" can also designate "n" to indicate no bulk contacts for an RF MOSFET. RF MOSFET parameter "Bulk Contact" can further designate any combination of "l", "r", "t" or "b" to indicate multiple locations of bulk contacts in an RF MOSFET layout.

Thus, in step 808, the present invention uses the RF MOSFET parameters discussed above to generate an RF MOSFET layout. According to the present invention, the RF MOSFET layout generated in step 808 results in parasitic resistors $R_G$ 304, $R_S$ 312, $R_{SB}$ 320, $R_{DSB}$ 328, $R_{DB}$ 324, $R_D$ 334, and parasitic capacitors $C_{JSB}$ 316 and $C_{JDB}$ 330 (all shown in FIG. 3) that were already used in step 806 to perform circuit simulation. In other words, the RF MOSFET layout generated in step 808 utilizes parameters such as $W_f$ 204, $L_f$ 206, $N_f$ 208, Current 210, Style 212, Slice 214, and Bulk Contact 216 (all shown in FIG. 2) that were inputted by the designer at step 804. The utilization of these parameters, i.e. $W_f$ 204, $L_f$ 206, $N_f$ 208, Current 210, Style 212, Slice 214, and Bulk Contact 216, would then result in a layout having the same parasitic values for resistors $R_G$ 304, $R_S$ 312, $R_{SB}$ 320, $R_{DSB}$ 328, $R_{DB}$ 324, $R_D$ 334, and capacitors $C_{JSB}$ 316 and $C_{JDB}$ 330 as the parasitic values that were used during circuit simulation in step 806.

Thus, according to the present invention, the layout generated at step 808 has, in effect, resulted in advance knowledge of the values of the internal parasitic resistors and capacitors of the RF MOSFET. As such, the values of the internal parasitic resistors and capacitors of the RF MOSFET have been accurately predicted and utilized during circuit simulation. Thus, according to the present invention, there is no need for an extraction of the values of the internal parasitic resistors and capacitors of an already laid out RF MOSFET. Further, there is generally no need to re-simulate the circuit with extracted values of the RF MOSFET internal parasitic resistors and capacitors. In other words, the simulation performed at step 806 has already taken into account accurate values of internal parasitic resistors and capacitors of the RF MOSFET.

In step 810 in FIG. 8, a design rule check ("DRC") and a layout vs. circuit schematic ("LVS") verification are performed on the circuit layout generated in step 808. DRC is performed to ensure that the circuit layout does not violate any manufacturing specifications. For example, the DRC program identifies problems such as "minimum-spacing" violations and "minimum-width" violations. In LVS, the circuit layout is checked to ensure that the layout is electrically or otherwise equivalent to the circuit schematic. In other words, checks are employed to ensure that the circuit layout does in fact represent the same topology specified by the circuit schematic.

In step 812, interconnect parasitics are extracted from the circuit layout. The interconnect parasitics extracted in step 812 do not include parasitics that are internal to the RF MOSFET since the RF MOSFET internal parasitics are already accurately known according to the present invention as described above. The parasitics that are extracted in step 812 are those parasitics that are generated by interconnect routing between the RF MOSFET and other circuit components. In an embodiment of the present invention, a commercial extraction tool, such as xCalibre®, is used for interconnect parasitic extraction. The commercial extraction tool is instructed to treat the RF MOSFET as a "black box" and not extract any parasitics inside the "black box." In other words, the commercial extraction tool only extracts parasitics that are generated by interconnect routing between the "black box," i.e. the RF MOSFET, and other circuit components. The parasitics inside the RF MOSFET can be ignored in step 812 because the RF MOSFET's internal parasitics were accurately predicted and utilized in the circuit simulation step 806.

Since much fewer parasitics have to be considered, post-layout simulation of a circuit comprising RF MOSFETs in the present invention is much faster and more predictable than post-layout simulation of the same circuit in a conventional design system. In other words, during post-layout simulation of a circuit comprising RF MOSFETs in the present invention, only the extracted interconnect parasitics must be taken into account. Thus, the present invention accommodates circuit design and layout generally in a single pass or, at worst case, without many circuit design, simulation, and layout generation cycles, as required by conventional design systems.

It is noted that post-layout simulation of a circuit comprising RF MOSFETs in a conventional design system is quite unpredictable. Thus circuit modification in a conventional design system can be quite extensive due to the large number of RF MOSFET internal parasitics that are extracted from the circuit layout. As a result, a conventional design system typically requires many iterations, such as iteration of steps 102, 104, 106, and 108 in FIG. 1, before the circuit design and layout generation cycles are completed. Thus, by generating an acceptable circuit layout and without requiring many iterations, the present invention's design system greatly reduces the time-to-market for circuits comprising RF MOSFETs.

Figure 9:
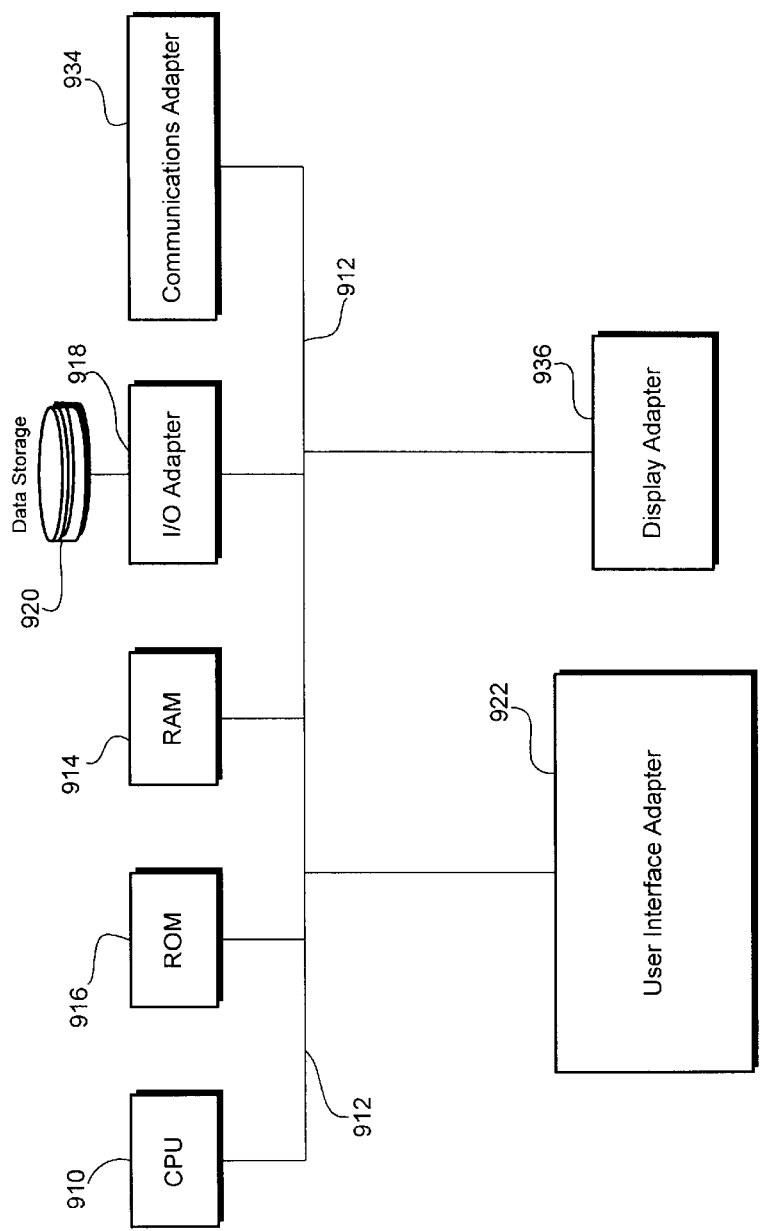
FIG. 9 shows a block diagram of a generic computer which can be utilized to implement an embodiment of the present invention.

By way of example, a typical computer which can be programmed to implement the invention is shown in FIG. 9. The computer programmed to implement the invention is typically part of a system of interconnected computers. Alternatively, the computer shown in FIG. 9 may itself be referred to as a "system" in the present application. The exemplary computer shown in FIG. 9 comprises a Central Processing Unit (CPU) 910, a Read Only Memory (ROM) 916, a Random Access Memory (RAM) 914, an Input/Output (I/O) Adapter 918, a disk storage (also called a hard drive) 920, a communications adapter 934, a user interface adapter 922, and a display adapter 936. Bus 912 couples CPU 910, ROM 916, RAM 914, I/O Adapter 918, communications adapter 934, user interface adapter 922, and display adapter 936 as shown in FIG. 9. User interface adapter 922 is typically coupled to an input device such as a keyboard (not shown in FIG. 9) to permit a user to communicate with and control the computer. Display adapter 936 is typically coupled to a monitor (not shown in FIG. 9) for the purpose of communicating and interacting with the user. By way of a more specific example, the computer shown in FIG. 9 may be a computer system such as an HP® 9000 or a Sun Solaris® work station which uses a 32-bit RISC type CPU as CPU 910. However, it is understood and appreciated by those skilled in the art that the invention may also be implemented using a variety of different types of computers other than those specifically mentioned in the present application.

It is appreciated by the above detailed description that the invention provides method and system for predictive MOSFET layout generation with reduced design cycle. The invention provides an integrated design system that is able to predict the size and effect of an RF MOSFET's internal parasitics and thereby use that knowledge to minimize undesirable repetition of steps in the circuit design system.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest from the above description that RF MOSFET subcircuit model 300 can include a greater number or a fewer number of parasitic resistors and capacitors, or may contain other parasitic elements, such as parasitic inductors. Moreover, the RF MOSFET subcircuit model can have a different circuit topology than that shown in FIG. 3. Also, the RF MOSFET subcircuit model may include other parasitic elements, such as parasitic inductors. Thus, the exact configuration of RF MOSFET subcircuit model may be different from that shown in FIG. 3. However, any differences are a matter of design choice and the invention's principles disclosed herein can be manifestly applied to any RF MOSFET subcircuit model of choice. Moreover, although the invention has been described by reference to an RF MOSFET, it is manifest to one of ordinary skill in the art that the invention applies to circuits that employ MOSFETs that are not used in RF circuits. In other words, the label "RF MOSFET" has been used merely as an example while the invention is also applicable to "non-RF" MOSFETs. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method and system for predictive MOSFET layout generation with reduced design cycle have been described.

What is claimed is:

1. A method for designing a circuit, said method comprising steps of:

receiving a plurality of parameter values for an RF MOSFET, wherein said plurality of parameter values comprises at least a slice parameter value and a current parameter value, said current parameter value determining a maximum electromigration current of said RF MOSFET, said plurality of parameter values determining a plurality of parasitic values of a subcircuit model of said RF MOSFET;

generating a layout of said RF MOSFET utilizing said plurality of parameter values, said layout causing said RF MOSFET to have said plurality of parasitic values.

2. The method of claim 1 further comprising a step of utilizing said plurality of parasitic values to simulate an electrical behavior of said RF MOSFET prior to said generating step.

3. The method of claim 1 wherein said plurality of parameter values comprise a style parameter value.

4. The method of claim 1 wherein said plurality of parameter values comprises a bulk contact parameter value.

5. The method of claim 1 wherein said plurality of parameter values further comprises finger width, finger length, number of fingers, style, and bulk contact parameter values.

6. The method of claim 1 wherein said parasitic values of said subcircuit model comprise a plurality of parasitic resistor values and a plurality of parasitic capacitor values.

7. The method of claim 6 wherein said plurality of parasitic resistor values and said plurality of parasitic capacitor values are determined by said plurality of parameter values.

8. The method of claim 6 further comprising a step of utilizing said plurality of resistor values and said plurality of capacitor values to simulate an electrical behavior of said RF MOSFET prior to said generating step.

9. The method of claim 3 wherein said style parameter value determines how interconnect lines are routed in said layout of said RF MOSFET.

10. The method of claim 4 wherein said bulk contact parameter value determines a location for bulk contacts in said layout of said RF MOSFET.

11. A method for designing a circuit including at least one RF MOSFET, said method comprising steps of:
    receiving a plurality of parameter values for said at least one RF MOSFET; wherein said plurality of parameter value comprises at least a slice parameter value and a current parameter value, said current parameter value determining a maximum electromigration current of said at least one RF MOSFET;
    determining a plurality of parasitic values in a subcircuit model for said at least one RF MOSFET;
    simulating an electrical behavior of said circuit utilizing said plurality of parasitic values;
    generating a layout of said circuit including said at least one RF MOSFET, said layout causing said at least one RF MOSFET to have said plurality of parasitic values.

12. The method of claim 11 further comprising a step of performing a design rule check after said step of generating said layout.

13. The method of claim 11 further comprising a step of performing a layout versus schematic verification after said step of generating said layout.

14. The method of claim 11 further comprising a step of extracting interconnect parasitics after said step of generating said layout.

15. The method of claim 11 wherein said plurality of parameter values comprise a style parameter value.

16. The method of claim 11 wherein said plurality of parameter values comprises a bulk contact parameter value.

17. The method of claim 11 wherein said plurality of parameter values further comprising finger width, finger length, number of fingers, style, and bulk contact parameter values.

18. The method of claim 11 wherein said parasitic values of said subcircuit model comprise a plurality of parasitic resistor values and a plurality of parasitic capacitor values.

19. The method of claim 18 wherein said plurality of parasitic resistor values and said plurality of parasitic capacitor values are determined by said plurality of parameter values.

20. The method of claim 18 further comprising a step of utilizing said plurality of resistor values and said plurality of capacitor values to simulate an electrical behavior of said at least one RF MOSFET prior to said step of generating said layout.

21. The method of claim 15 wherein said style parameter value determines how interconnect lines are routed in said layout of said at least one RF MOSFET.

22. The method of claim 16 wherein said bulk contact parameter value determines a location for bulk contacts in said layout of said at least one RF MOSFET.

23. A system comprising a computer for designing a circuit including at least one RF MOSFET, said computer implementing a method comprising steps of:
    said computer receiving a plurality of parameter values for said at least one RF MOSFET in said circuit, wherein said plurality of parameter values comprises at least a slice parameter value and a current parameter value, said current parameter value determining a maximum electromigration current of said at least one RF MOSFET;
    said computer determining a plurality of parasitic values in a subcircuit model of said at least one RF MOSFET;
    said computer generating a layout of said at least one RF MOSFET utilizing said plurality of parameter values, said layout causing said at least one RF MOSFET to have said plurality of parasitic values.

24. The system of claim 23 wherein said method further comprises a step of said computer utilizing said plurality of parasitic values to simulate an electrical behavior of said at least one RF MOSFET prior to said step of said computer generating said layout.

25. The system of claim 23 wherein said method further comprises a step of said computer performing a design rule check after said step of said computer generating said layout.

26. The system of claim 23 wherein said method further comprises a step of said computer performing a layout versus schematic verification after said step of said computer generating said layout.

27. The system of claim 23 wherein said method further comprises a step of said computer extracting interconnect parasitics after said step of said computer generating said layout.

28. The system of claim 23 wherein said plurality of parameter values comprise a style parameter value.

29. The system of claim 23 wherein said plurality of parameter values comprises a bulk contact parameter value.

30. The system of claim 23 wherein each of said plurality of parameter values further comprise finger width, finger length, number of fingers, style, and bulk contact parameter values.

31. The system of claim 23 wherein said parasitic values of said subcircuit model comprise a plurality of parasitic resistor values and a plurality of parasitic capacitor values.

32. The system of claim 31 wherein said plurality of parasitic resistor values and said plurality of parasitic capacitor values are determined by said plurality of parameter values.

33. The system of claim 28 wherein said style parameter value determines how interconnect lines are routed in said layout of said at least one RF MOSFET.

34. The system of claim 29 wherein said bulk contact parameter value determines a location for bulk contacts in said layout of said at least one RF MOSFET.

35. A method for designing a circuit including at least one MOSFET, said method comprising the steps of:
    receiving a plurality of parameter values for said at least one MOSFET, wherein said plurality of parameter values comprises at least a slice parameter value and a current parameter value, said current parameter value determining a maximum electromigration current of said at least one MOSFET;

determining a plurality of parasitic values in a subcircuit model for said at least one MOSFET;

simulating an electrical behavior of said circuit utilizing said plurality of parasitic values;

generating a layout of said circuit including said at least one MOSFET, said layout causing said at least one MOSFET to have said plurality of parasitic values.

36. The method of claim 35 further comprising a step of performing a design rule check after said step of generating said layout.

37. The method of claim 35 further comprising a step a performing a layout versus schematic verification after said step of generating said layout.

38. The method of claim 35 further comprising a step of extracting interconnect parasitics after said step of generating said layout.

39. The method of claim 35 wherein said plurality of parameter values comprise a style parameter value.

40. The method of claim 35 wherein said plurality of parameter values comprises a bulk contact parameter value.

41. The method of claim 35 wherein said plurality of parameter values further comprise finger width, finger length, number of fingers, style, and bulk contact parameter values.

42. The method of claim 35 wherein said parasitic values of said subcircuit model comprise a plurality of parasitic resistor values and a plurality of parasitic capacitor values.

43. The method of claim 42 wherein said plurality of parasitic resistor values and said plurality of parasitic capacitor values are determined by said plurality of parameter values.

44. The method of claim 42 further comprising a step of utilizing said plurality of resistor values and said plurality of capacitor values to simulate an electrical behavior of said at least one MOSFET prior to said step of generating said layout.

45. The method of claim 39 wherein said style parameter value determines how interconnect lines are routed in said layout of said at least one MOSFET.

46. The method of claim 40 wherein said bulk contact parameter value determines a location for bulk contacts in said layout of said at least one MOSFET.

* * * * *

UNITED STATES PATENT AND TRADEMARK OFFICE
CERTIFICATE OF CORRECTION

PATENT NO. : 6,728,942 B2
DATED : April 27, 2004
INVENTOR(S) : Lampaert et al.

It is certified that error appears in the above-identified patent and that said Letters Patent is hereby corrected as shown below:

Column 16,
Line 43, reading "wherein each of said plurality" should read -- wherein said plurality --.

Signed and Sealed this

Twenty-ninth Day of June, 2004

JON W. DUDAS
*Acting Director of the United States Patent and Trademark Office*